United States Patent
Fukami

[11] Patent Number: 5,828,308
[45] Date of Patent: Oct. 27, 1998

[54] CURRENT SENSING CIRCUIT FORMED IN NARROW AREA AND HAVING SENSING ELECTRODE ON MAJOR SURFACE OF SEMICONDUCTOR SUBSTRATE

[75] Inventor: Ikuo Fukami, Tokyo, Japan

[73] Assignee: NEC Corporation, Tokyo, Japan

[21] Appl. No.: 906,503

[22] Filed: Aug. 5, 1997

[30] Foreign Application Priority Data

Aug. 6, 1996 [JP] Japan .................................. 8-207237

[51] Int. Cl.⁶ .................................................. G08B 21/00
[52] U.S. Cl. ........................ 340/664; 323/312; 361/93; 326/82
[58] Field of Search .................................. 340/664, 657; 323/312, 315, 316; 361/93, 100; 326/82

[56] References Cited

U.S. PATENT DOCUMENTS

| | | | |
|---|---|---|---|
| 4,121,122 | 10/1978 | Pokrandt | 307/362 |
| 4,250,501 | 2/1981 | Pokrandt | 340/664 |
| 4,553,084 | 11/1985 | Wrathall | 323/316 |
| 5,008,586 | 4/1991 | Miyazaki et al. | 323/315 |
| 5,521,536 | 5/1996 | Yamashita et al. | 362/82 |
| 5,670,867 | 9/1997 | Mitsuda | 323/312 |

FOREIGN PATENT DOCUMENTS

1-303761  12/1989  Japan .

*Primary Examiner*—Edward Lefkowitz
*Attorney, Agent, or Firm*—Whitham, Curtis & Whitham

[57] ABSTRACT

A current sensing circuit is provided for a current driving transistor to see whether or not excess current flows into an external load, a vertical transistor serves as the current driving transistor and a resistor for converting the amount of driving current to a potential drop, and a drain node connected to a power supply line, and a source node connected to the external load and a sensing node connected to a voltage comparator are provided on a major surface of a semiconductor substrate so as to supply various electric powers through a plurality of current driving transistors respectively accompanied with current sensing circuits and integrated on a single semiconductor chip to the external load.

9 Claims, 10 Drawing Sheets

CURRENT SENSING CIRCUIT FORMED IN NARROW AREA AND HAVING SENSING ELECTRODE ON MAJOR SURFACE OF SEMICONDUCTOR SUBSTRATE

FIELD OF THE INVENTION

This invention relates to a current sensing circuit and, more particularly, to a current sensing circuit for detecting excess current.

DESCRIPTION OF THE RELATED ART

Figure 1:
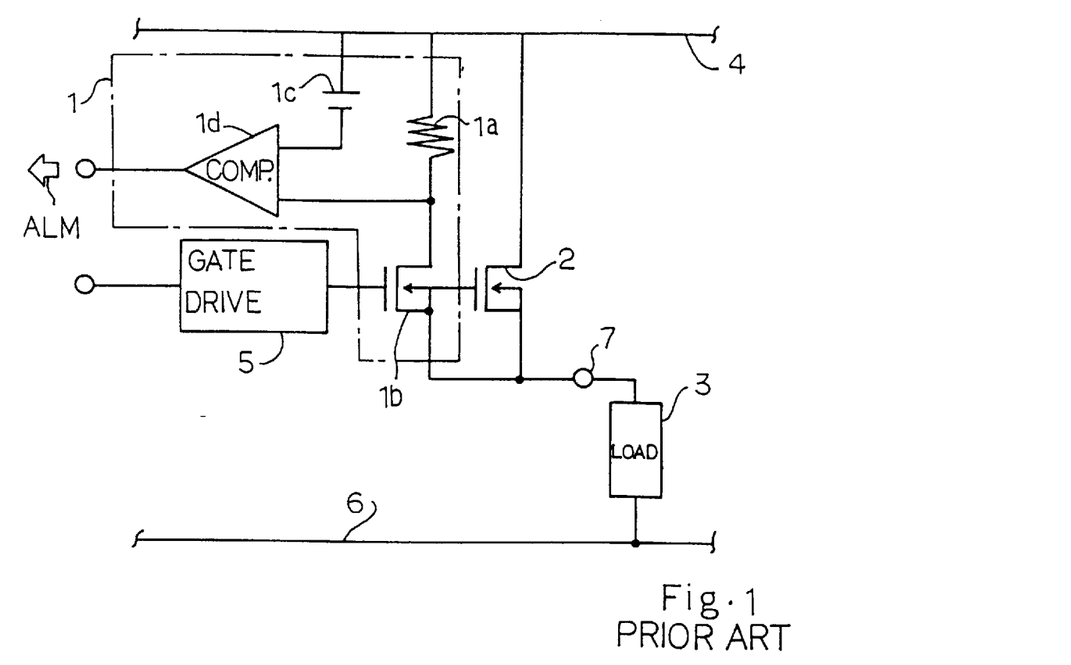
FIG. 1 is a circuit diagram showing the prior art current sensing circuit disclosed in U.S. Pat. No. 4,553,084.

A typical example of the current sensing circuit for detecting excess current is disclosed in U.S. Pat. No. 4,553,084, and the circuit configuration of the prior art current sensing circuit is illustrated in FIG. 1 of the drawings. The prior art current sensing circuit 1 is incorporated in an integrated circuit together with a driving transistor 2, and the driving transistor 2 is powered with a power supply line 4. A gate drive 5 controls the driving transistor 2 so as to drive a load 3 coupled between another power supply line 6 and an output node 7 of the integrated circuit device.

The prior art current sensing circuit 1 includes a series of resistor 1a and a detecting transistor 1b connected between the power supply line 4 and the output node 7, a reference potential source 1c connected to the power supply line 4 and a voltage comparator 1d for producing an alarm signal ARM. The detecting transistor 1b is gated by the gate drive 5 concurrently with the driving transistor 2, and the resistor 1a converts the current passing therethrough to a potential drop.

The detecting transistor 1b and the driving transistor 2 are much larger in channel resistance than the resistor 1a, and the potential drop through the resistor 1a is ignorable with respect to the potential drop through each transistor 1b/2. For this reason, the potential drop through the driving transistor 2 is approximately equal to the total potential drop through the resistor 1a and the detecting transistor 1b. The detecting transistor 1b is identical in transistor structure with the driving transistor 2, and only the transistor size is different between the detecting transistor 1b and the driving transistor 2. The driving transistor 2 allows a large amount of driving current to pass therethrough, and a small amount of detecting current passes through the detecting transistor 1. However, the driving transistor 2 varies the driving current in proportion to the detecting current.

The voltage comparator 1d has two input nodes one of which is connected to the drain node of the detecting transistor 1b and the other of which is connected to the reference potential source 1c. The reference potential source 1c supplies a reference potential level representative of the critical current, and the voltage comparator compares the potential level at the drain node with the reference potential level to see whether or not the detecting current and, accordingly, the driving current exceed a critical value.

While the driving current falls within a standard range, the detecting current does not exceed the critical value, and the potential level at the drain node is lower than the reference potential level. The voltage comparator 1d does not produce the alarm signal ALM. However, if the driving transistor 2 starts to supply excess current to the load 3, the detecting current also exceeds the critical value, and the potential drop through the resistor 1a becomes large. As a result, the potential level at the drain node is lower than the reference potential level, and the voltage comparator 1d produces the alarm signal ALM.

When the gate drive 5 causes the driving transistor 2 and the detecting transistor 1b to turn off, no current flows through the detecting transistor 1b, and the potential level at the drain node is higher than the reference potential level. For this reason, the comparator 1d never produces the alarm signal ALM.

Figure 2:
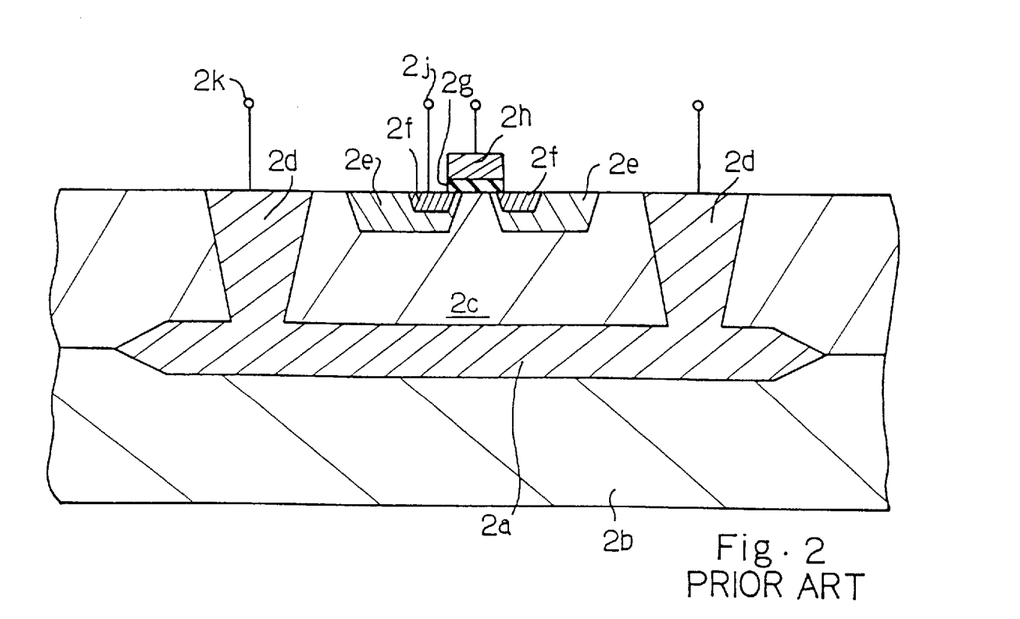
FIG. 2 is a cross sectional view showing the structure of the driving transistor available for the prior art current sensing circuit.
Figure 3:
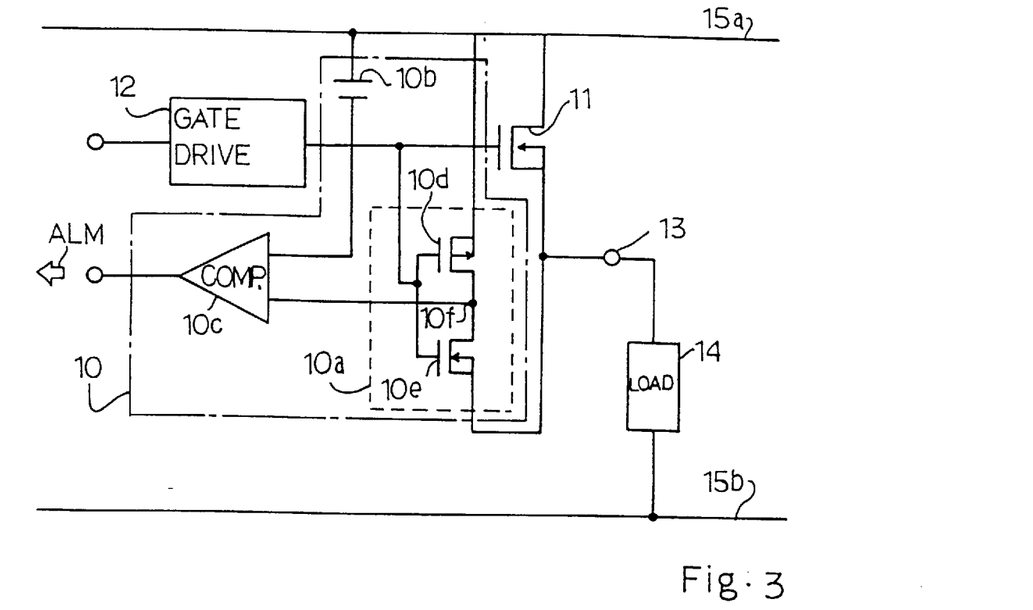
FIG. 3 is a circuit diagram showing the current sensing circuit disclosed in Japanese Patent Application No. 7-190317.

The driving transistor 2 and the detecting transistor 1b are of a vertical transistor. The U.S. Patent says that the driving transistor and the detecting transistor preferably would comprise a vertical power structure having a substrate serving as a drain (see column 2, lines 50 to 52). FIG. 2 illustrates the structure of the vertical power transistor. An n-type buried layer 2a is sandwiched between a p-type substrate 2b and an n-type epitaxial layer 2c, and an n-type contact region 2d projects from the surface of the n-type epitaxial layer 2c into the n-type buried layer 2a. A p-type base region 2e is formed in the n-type epitaxial layer 2c, and a heavily doped n-type region 2f is formed in the p-type base region 2e. The major surface inside the heavily-doped n-type region 2f is covered with a gate oxide layer 2g, and the gate oxide layer 2g is overlain by a polysilicon gate electrode 2h. A source electrode 2j is connected to the heavily doped n-type region 2f, and a drain electrode 2k is connected to the n-type contact region 2d. The polysilicon gate electrode 2h is connected to the gate drive 5. The vertical transistor structure is of a p-n junction isolating type. Another current sensing circuit is disclosed in Japanese Patent Application No. 7-190317, and FIG. 3 illustrates the current sensing circuit. Japanese Patent Application No. 7-190317 was filed on Jul. 26, 1995, and the specification and the drawings for the Japanese Patent Application were published after the priority date of the present application. However, both of the inventor for the Japanese Patent Application and the present inventor have been working for NEC Corporation, and the present inventor had the knowledge about the current sensing circuit.

The current sensing circuit 10 is provided for a driving transistor 11. The driving transistor 11 is controlled by a gate drive 12, and supplies driving current through an output node 13 to a load 14 as similar to the prior art current sensing circuit shown in FIG. 1.

The current sensing circuit 10 includes a switching inverter 10a connected between the power voltage line 15a and the output node 13, a reference voltage source 10b connected to the power supply line 15a and a voltage comnparator 10c for producing an alarm signal ALM. The switching inverter 10a is implemented by a series combination of a p-channel type switching transistor 10d and an n-channel type switching transistor 10e, and the p-channel type switching transistor 10d and the n-channel type transistor 10e are gated by the gate drive 12. The voltage comparator 10c has two input nodes one of which is connected to the reference voltage source 10b and the other of which is connected to an output node 10f of the switching inverter 10a.

When the gate drive 12 supplies a control signal of the active high level, the driving transistor 1 turns on so as to supply the driving current to the load 14, and a potential drop takes place between the power supply line 15a and the output node 13. The n-channel type-switching transistor 10e concurrently turns on, and the output node 13 is electrically connected to the output node 10f. The potential level at the output node 13 is propagated through the n-channel type switching transistor 10e to the output node 10f, and the voltage comparator 10c compares the potential level at the output node 13 with the reference potential level.

While the driving current falls within a standard range, the potential drop is relatively small, and the potential level at the output node 13 is higher than the reference level.

However, if excess current flows through the output node 13, the potential drop becomes large, and the voltage comparator 10c decides the potential level at the output node 13 to be lower than the reference level. Then, the voltage comparator 10c produces the alarm signal ALM.

When the gate drive 12 changes the control signal to inactive low level, both of the driving transistor 11 and the n-channel type switching transistor 10e concurrently turn off, and the p-channel type switching transistor 10d turns on. Then, the power voltage level is supplied through the p-channel type switching transistor 10d and the output node 10f to the voltage comparator 10c, and the voltage comparator 10c never produces the alarm signal ALM.

Figure 4:
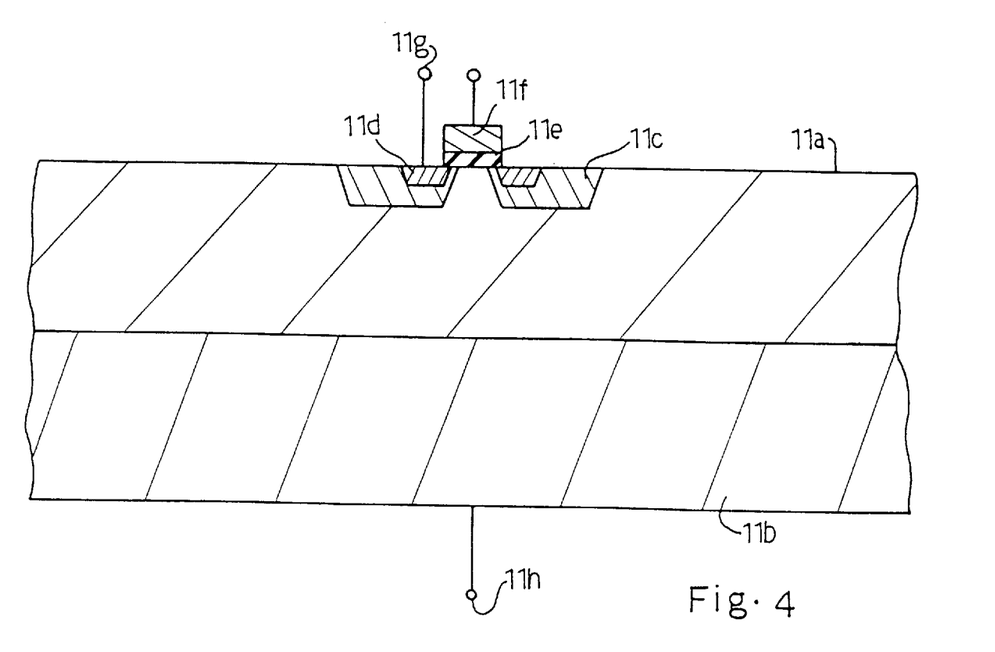
FIG. 4 is a cross sectional view showing the structure of the driving transistor incorporated in the Japanese Patent Application.

The driving transistor 11 is of a vertical type transistor, and has the structure shown in FIG. 4. An n-type epitaxial layer 11a is grown on an n-type substrate 11b, and a p-type base region 11c is formed in a surface area of the n-type epitaxial layer 11a. A heavily doped n-type region 11d is nested in tile p-type base region 11c, and a gate oxide layer 11e is grown over the major surface inside the heavily doped n-type region 11d. A gate electrode 11f is formed on the gate oxide layer 11e. The heavily doped n-type region 11d is connected to a source electrode 11g, and a drain electrode 11h is connected to the reverse surface of the n-type substrate 11b. The gate electrode 11f is connected to the gate drive 12. A self-isolation technique is used in the transistor structure.

Figure 5:
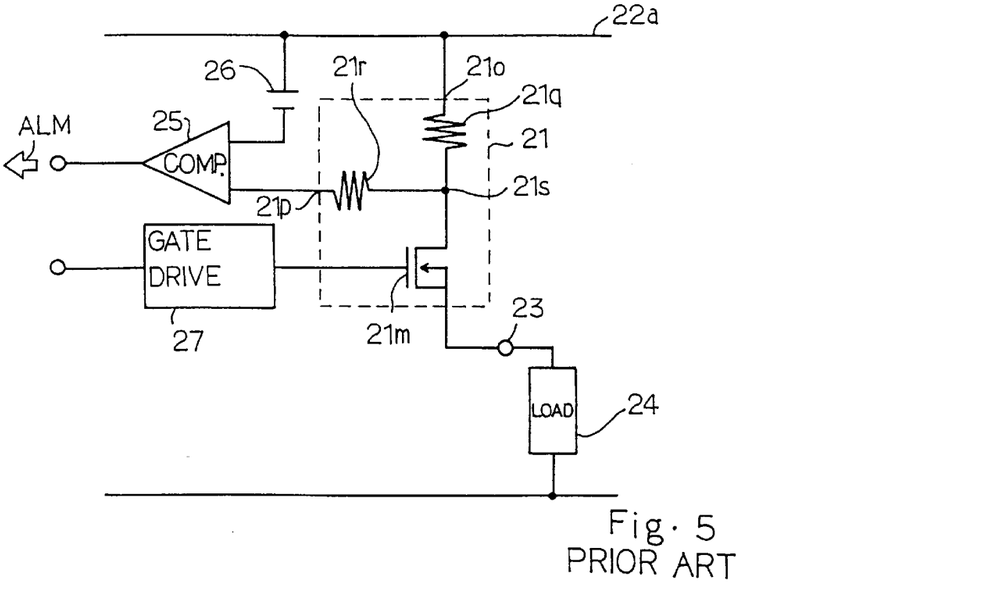
FIG. 5 is a circuit diagram showing the prior art current sensing circuit disclosed in Japanese Patent Publication of Unexamined Application No. 1-303761.

Another prior art current sensing circuit is disclosed in Japanese Patent Publication of Unexamined Application No. 1-303761, and FIG. 5 illustrates the circuit configuration of the prior art current sensing circuit.

Figure 6:
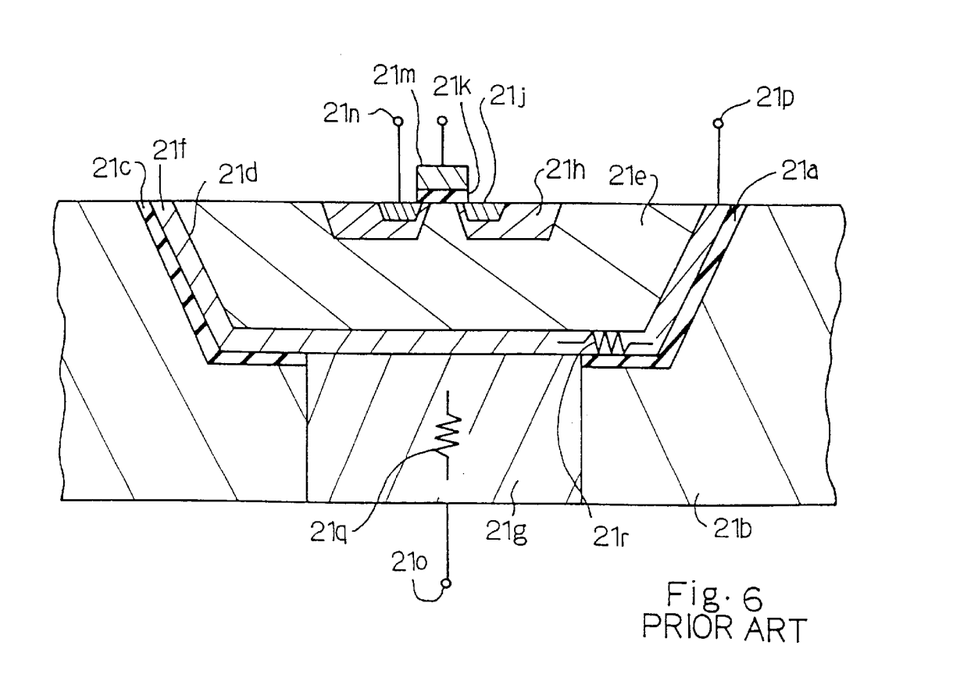
FIG. 6 is a cross sectional view showing the structure of the driving transistor incorporated in the current sensing, circuit shown in FIG. 5.

First, the structure of a vertical transistor 21 is described with reference to FIG. 6. A primary cavity 21a is formed in a polysilicon layer 21b, and the inner surface of the polysilicon layer 21b is covered with an insulating layer 21c, and the insulating layer 21c defines a secondary cavity 21d. The secondary cavity 21d is filled with a lightly doped n-type single crystal silicon 21e, and a heavily doped n-type layer 21f is formed in the lightly doped n-type single crystal silicon layer 21e along the boundary between the insulating layer 21c and the lightly doped n-type single crystal silicon layer 21e. A contact hole is formed in the insulating layer 21a, and a heavily doped n-type region 21g is exposed to the contact hole. For this reason, the heavily doped n-type layer 21f is held in contact with the heavily doped n-type region 21g. Thus, a dielectric isolation is employed in the transistor structure.

A p-type base region 21h is formed in a surface portion of the lightly doped n-type single crystal silicon layer 21e, and a heavily doped n-type region 21j is nested in the p-type base region 21h. A major surface inside the heavily doped n-type region 21j is covered with a gate oxide layer 21k, and a gate electrode 21m is laminated on the gate oxide layer 21k.

Figure 7:
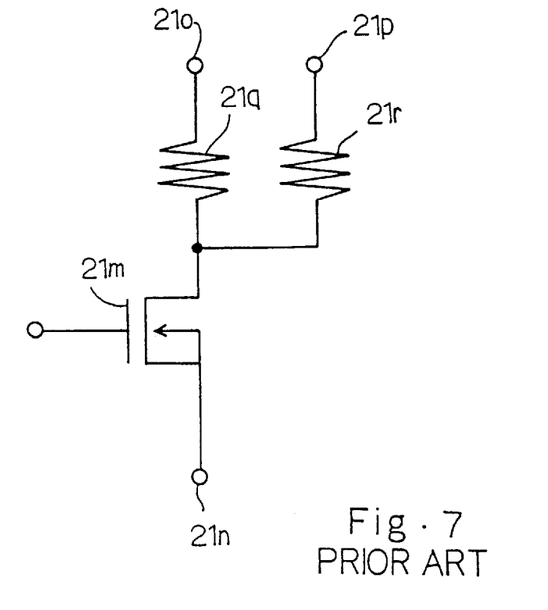

A source electrode 21n is connected to the heavily doped n-type region 21j and a drain electrode 21o and a sense electrode 21p are connected to the heavily doped n-type region 21g and the heavily doped n-type layer 21f, respectively. The heavily doped n-type region 21g provides a drain resistance 21q against the current to the drain electrode 21o, and the heavily doped n-type layer 21f provides another resistance 21r against the current to the sense electrode 21p. For this reason, the transistor structure shown in FIG. 6 is equivalent to the circuit shown in FIG. 7, and serves as not only a driving transistor for the load 24 but also a current-to-voltage converter.

The vertical transistor 21 is connected between a power voltage line 22a and an output node 23, and supplies driving current to a load 24. The sense electrode 21p is connected to one of the two input nodes of a voltage comparator 25, and the other input node is connected to a reference voltage source 26. A gate drive 27 supplies a control signal to the gate electrode 21m.

Assuming now that the gate drive 27 changes the control signal from inactive low level to active high level, the vertical transistor 21 turns oil, and the driving current flows through the drain resistance 21q into the load 24. A potential drop takes place between the power supply line 22a and a node 21s. The comparator 25 compares the potential level at the node 21s with the reference level supplied from the reference potential source 26 to see whether or not the driving current falls within a standard range.

If excess current flows into the load 24, the drain resistance 21q increases the potential drop, and the potential level at the node 21s becomes lower than the reference level. Then, the comparator 25 produces an alarm signal ALM.

While the gate drive 27 maintains the vertical transistor 21 in the off-state, the potential level at the node 21s is higher than the reference level, and the comparator 25 never produces the alarm signal ALM.

However, the above-described current sensing circuits encounter problems as follows.

The detecting transistor 1b is required to be identical in transistor structure to the driving transistor 2, and, accordingly, not only the driving, transistor 2 but also the detecting transistor 1b have the vertical transistor structure. The vertical transistor requires wide area. Especially, both of the driving transistor 2 and the detecting transistor 1b use the n-type epitaxial layer 2c as the drains, and an isolation region is indispensable between the driving transistor 2 and the detecting transistor 1b. As a result, the prior art current sensing circuit consumes a large amount of real estate. This is the problem inherent in the prior art current sensing circuit disclosed in the U.S. Patent.

The current sensing, circuit disclosed in Japanese Patent Application No. 7-190317 has a problem in the number of circuit components. The potential level at the output node 13 is transferred through the switching inverter 10 to the voltage comparator 10c, and the switching inverter 10 is indispensable for the current sensing circuit. Because, the comparator 10c mistakenly produces the alarm signal ALM due to the potential level at the output node 13 propagated from the power supply line 15b.

The prior art current sensing circuit disclosed in Japanese Patent Publication of Unexamined Application No. 1-303761 encounters a problem in an integration on a single semiconductor substrate. If the load 24 requires a multiple power source, the manufacturer connects different power supply lines through a plurality of vertical transistors 21 to the load 24. However, the drain electrode 21o is provided on the reverse surface of the semiconductor substrate, and the manufacturer can not fabricate the plurality of vertical transistors 21 on a single semiconductor substrate. If the plurality of vertical transistors 21 are fabricated on semiconductor substrates, respectively, the prior art current sensing circuit suffers from a high production cost.

SUMMARY OF THE INVENTION

It is therefore an important object of the present invention to provide a current sensing circuit, which is fabricated, from a small number of circuit components on narrow real estate of a single semiconductor chip.

To accomplish the object, the present invention proposes to provide drain and sense electrodes of a vertical transistor on a major surface of a semiconductor substrate.

In accordance with one aspect of the present invention, there is provided a current sensing circuit for monitoring a current driving transistor connected at a first current node thereof to a load to see whether or not the amount of driving current is within a standard range, comprising: a current-to-voltage converter connected between a power voltage line and a second current node of the current driving transistor for producing a potential level variable with the amount of the driving current at the second current node, the current-to-voltage converter and the current driving transistor being implemented by a vertical transistor fabricated on a semiconductor substrate structure having a major surface; a reference potential source for producing a constant reference potential level; and a voltage comparator having two input nodes connected to a sense node and the reference potential source so as to compare the potential level with the reference potential level for producing a signal representative of the driving current out of the standard range, and the vertical transistor includes a drain region of a first conductivity type formed on the semiconductor substrate and providing the second current node and the sensing node on a first area exposed to the major surface, a base region of a second conductivity type opposite to the first conductivity type and formed over a second area of the drain region, a source region of the first conductivity type formed in a central area of the base region and having an area serving as the first current node and exposed to the major surface, a channel region formed between the drain region and the base region for providing a current path between the source region and the drain region,, a gate insulating layer covering a part of the channel region and a peripheral area of the base region, and a gate electrode formed on the gate insulating layer.

BRIEF DESCRIPTION OF THE DRAWINGS

The features and advantages of the current sensing circuit will be more clearly understood from the following description taken in conjunction with the accompanying drawings in which.

Fig, 7 is a circuit diagram showing the equivalent circuit of the driving transistor.

DESCRIPTION OF THE PREFERRFD EMBODIMENTS

First Embodiment

Figure 8:
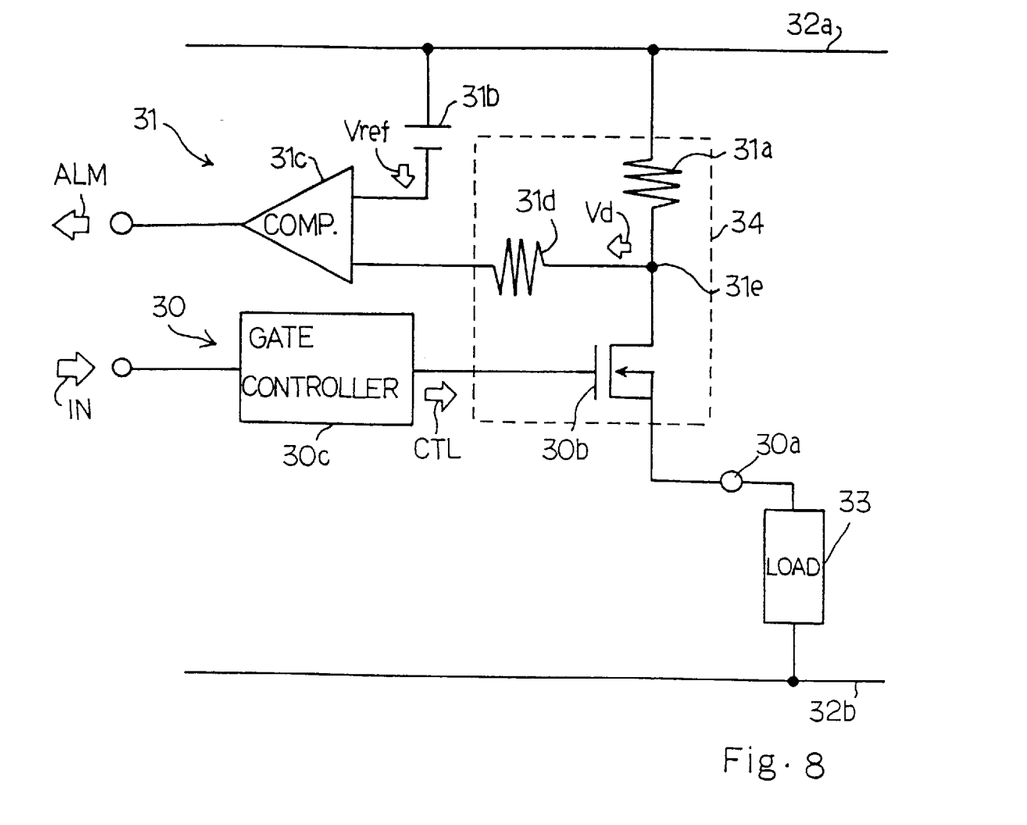
FIG. 8 is a circuit diagram showing the circuit configuration of a current sensing circuit according to the present invention.

Referring first to FIG. 8 of the drawings, a driving circuit 30 is accompanied with a current sensing circuit 31 embodying the present invention, and 34. An n-type epitaxial layer 34a is grown to 8 microns to 10 microns thick supplies driving current from a positive power voltage line 32a through an output node 30a to an external load 33 connected to a negative power supply line 32b. The driving circuit 30 includes a driving transistor 30b connected through the output node 30a to the external load 33 and a gate controller 30c for switching the driving transistor 30b between on-state and off-state. The gate controller 30c is responsive to an input signal IN for producing a gate control signal CTL. While the gate control signal CTL remains inactive low, the driving transistor 30b is turned off, and no driving current is supplied to the external load 33. When the gate controller 30c changes the gate control signal CTL to the active level, the driving transistor 30b turns on, and the driving current flows through the driving transistor 30b into the external load The current sensing circuit 31 includes a resistor 31a, a reference voltage generator 31b, a voltage comparator 31c and a resistor 31d, and monitors the driving current to see whether or not the driving current is within a standard range. When the driving current exceeds a critical value, the voltage comparator 31c changes an alarm signal ALM from inactive level to active level.

The resistor 31a is connected between the positive power supply line 32a and the driving transistor 30b, and a potential drop takes place across the resistor 31a. The potential drop is proportional to the amount of driving current, and, accordingly, the potential level at a node 31e is representative of the amount of the driving current. Thus, the resistor 31a serves as a current-to-voltage converter.

The reference voltage generator 31b is connected to the positive power supply line 32a, and a constant potential drop takes place across the reference voltage generator 31b. Thus, the reference voltage generator 31b produces a reference potential level Vref, and the reference potential level Vref is adjusted to an upper critical value of the standard range.

The voltage comparator 31c has two input nodes. One of the input nodes is connected through the resistor 31d to the node 31e, and the other input node is connected to the reference voltage generator 31b. The potential level Vd and the reference potential level Vref are supplied to the two input nodes of the voltage comparator 31c, and the voltage comparator 31c compares the potential level Vd with the reference potential level Vref to see whether or not the amount of detecting current falls within the standard range. When the driving current exceeds the upper critical value, the potential level Vd becomes lower than the reference potential level Vref, and the voltage comparator 31c changes the alarm signal ALM to the active level. However, the potential level Vd is as high as the positive power supply line 32a during the off-state of the driving transistor 30b, and the voltage comparator 31c maintains the alarm signal ALM in the inactive level.

Figure 9:
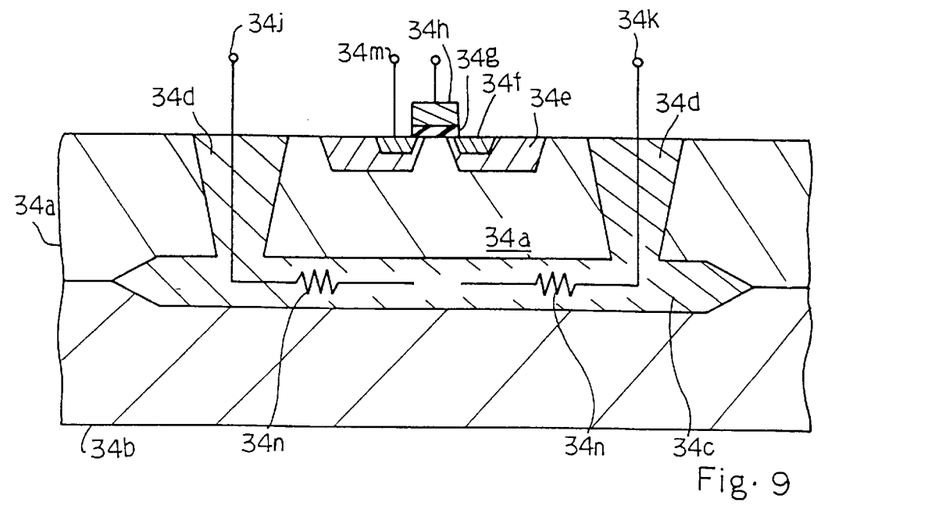
FIG. 9 is a cross sectional view showing the structure of a vertical transistor incorporated in the current sensing circuit.

The driving transistor 30b and the resistors 31a/31d are implemented by a single vertical transistor 34. FIG. 9 illustrates the structure of the vertical transistor 34 on a p-type silicon substrate 34b, and the resistivity of the n-type epitaxial layer 34a is 0.5 ohm-cm to 0.7 ohm-cm. An n-type buried layer 34c is formed between the p-type silicon substrate and the n-type epitaxial layer 34a, and is regulated to 14 to 22 ohm/square. N-type dopant impurity is selectively ion implanted into the n-type epitaxial layer 34a at dose of 1.0 E16/square-cm, and forms a heavily doped n-type region 34d merged with the n-type buried layer 34c. The heavily doped n-type region 34d is exposed to a major surface of the n-type epitaxial layer 34a. P-type dopant impurity is selectively ion implanted into the n-type epitaxial layer 34a inside the heavily doped n-type region 34d at dose of 3.5E15/square-cm, and forms a p-type base region 34e. N-type dopant impurity is selectively ion implanted into the p-type base region 34e at dose of 1.0E16/square-cm, and forms a heavily doped n-type impurity region 34f in the p-type base region 34e. The n-type buried layer 34c and the heavily doped n-type region 34d serve as a drain region, and the heavily doped n-type impurity region 34f serves as a source region. The n-type epitaxial layer 34a inside the heavily doped n-type region 34d provides a current path to the drain region.

A gate insulating layer 34g is formed on the major surface of the n-type epitaxial layer 34a inside the heavily doped n-type impurity region 34f, and is of the order of 500 angstroms thick. A polysilicon gate electrode 34h is formed on the gate insulating layer 34g, and is connected to the gate controller 30c.

A drain electrode 34j is provided on an upper surface of the heavily doped n-type region 34d, and a part of the drain electrode 34j serves as a sense electrode 34k. Thus, both of the drain electrode 34j and the sense electrode 34k are provided on the major surface of the n-type epitaxial layer 34a. A source electrode 34m is connected to the heavily doped n-type impurity region 34f, and is also provided on the major surface of the n-type epitaxial layer 34a.

Figure 10:
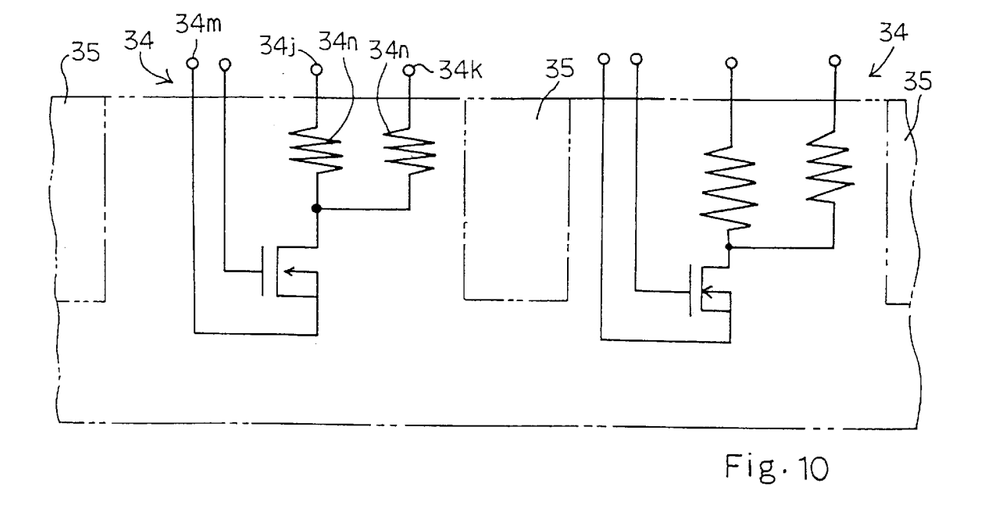
FIG. 10 is a circuit diagram showing the equivalent circuit of the vertical transistor.

A source-to-drain current path provides resistance, and the n-type region from the channel to the drain/sense electrodes 34j/34k serve as resistors 34n corresponding to the resistors 31a/31d. For this reason, the vertical transistor 34 is equivalent to the combination of the driving transistor 30b and the resistors 31a/31d, and a plurality of vertical transistors 34 are integrated on the substrate 34a/34b by using an appropriate isolation technology 35 as shown in FIG. 10.

As will be understood from the foregoing description, the detecting transistor 1b and the switching inverter 10a are not required for the current sensing circuit 31, and the current sensing circuit 31 is smaller in circuit components than the current sensing circuits illustrated in FIGS. 1 and 3. Accordingly, the current sensing circuit 31 occupies narrow real estate. Moreover, the manufacturer can integrate a plurality of vertical transistors 34 on a single semiconductor substrate, and the driving current is supplied from different power supply lines to external load circuits through the plurality of vertical transistors integrated on the single semiconductor substrate.

Second Embodiment

Figure 11:
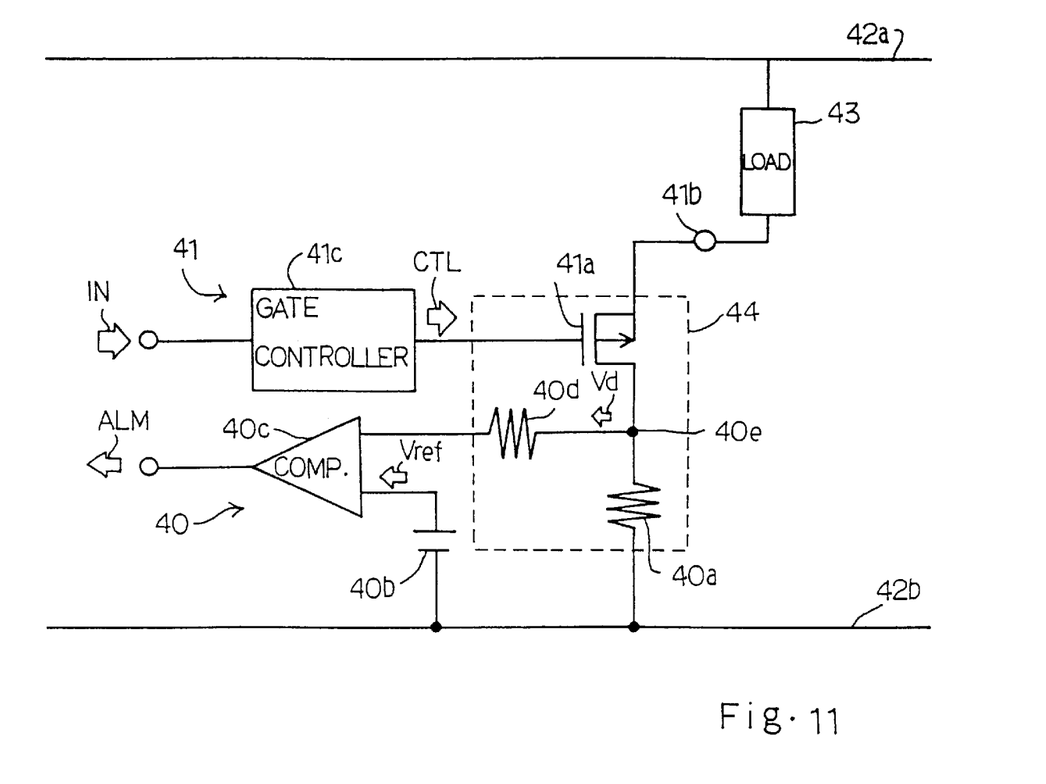
FIG. 11 is a circuit diagram showing another current sensing circuit according to the present invention.

FIG. 11 illustrates another current sensing circuit 40 embodying the present invention. The sensing circuit 40 monitors a current driving circuit 41 which discharges driving current from a positive power voltage line 42a through an external load 43 to a negative power supply line 42b. The driving circuit 41 includes a driving transistor 41a connected through an input node 41b to the external load 43 and a gate controller 41c for switching, the driving transistor 41 a between on state and off state. The gate controller 41c is responsive to an input signal IN for producing a gate control signal CTL. While the gate control signal CTL remains inactive low, the driving transistor 41a is turned off, and no driving current is supplied from the external load 43. When the gate controller 41c changes the gate control signal CTL to the active level, the driving transistor 41 a turns on, and the driving current flows through the driving transistor 41a into the negative power supply line 42b.

The current sensing circuit 40 includes a resistor 40a, a reference voltage generator 40b, a voltage comparator 40c and a resistor 40d, and monitors the driving current to see whether or not the driving- current is within a standard range. When the driving current exceeds a critical value, the voltage comparator 40c changes an alarm signal ALM from inactive level to active level.

The resistor 40a is connected between tile driving, transistor 41a and the negative power supply line 32b, and a potential drop takes place across the resistor 40a. The potential drop is proportional to the amount of driving current, and, accordingly, the potential level at a node 40e is representative of the amount of the driving current. Thus, the resistor 40a serves as a current-to-voltage converter.

The reference voltage generator 40b is connected to the negative power supply line 42b, and a constant potential drop takes place across the reference voltage generator 40b. Thus, the reference voltage generator 40b produces a reference potential level Vref, and the reference potential level Vref is adjusted to the critical value of the standard range.

The voltage comparator 40c has two input nodes. One of the input nodes is connected through the resistor 40d to the node 40e, and the other of the input nodes is connected to the reference voltage generator 40b. The potential level Vd and the reference potential level Vref are Supplied to the two input nodes of the voltage comparator 40c, and the voltage comparator 40c compares the potential level Vd with the reference potential level Vref to see whether or not the amount of detecting current falls within the standard range. When the driving Current exceeds the upper Critical value, the potential level Vd becomes higher than the reference potential level Vref, and the voltage comparator 40c changes the alarm signal ALM to the active level. However, the potential level Vd is as low as the negative power supply line 42b during the off-state of the driving transistor 41a, and the voltage comparator 40c maintains the alarm signal ALM in the inactive level.

Figure 12:
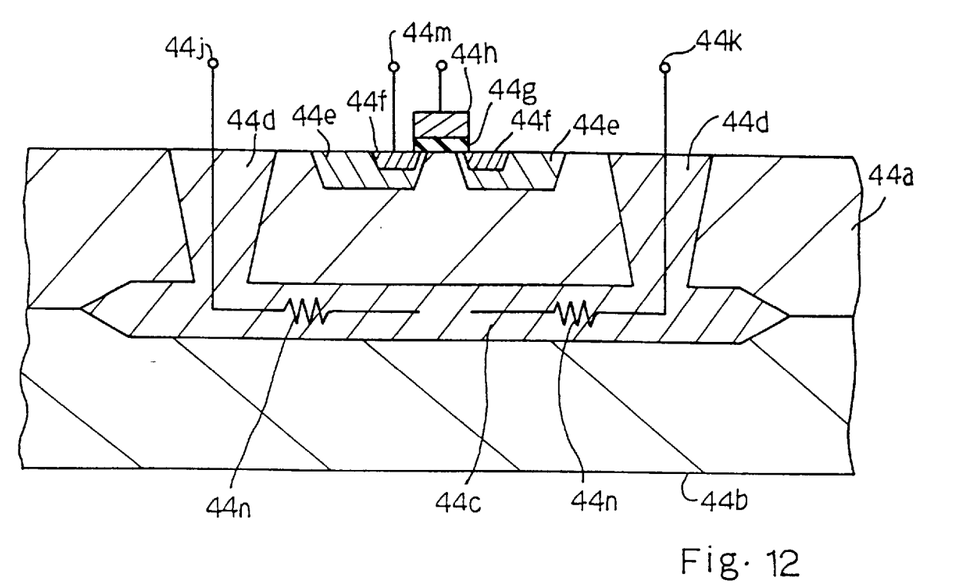
FIG. 12 is a cross sectional view showing the structure of a vertical transistor incorporated in the current sensing circuit.

The driving transistor 41a and the resistors 40a/40d are implemented by a single vertical transistor 44. FIG. 12 illustrates the structure of the vertical transistor 44. A p-type epitaxial layer 44a is grown to 8 microns to 10 microns thick on an n-type silicon substrate 44b, and the resistivity of the p-type epitaxial layer 44a is 0.5 ohm-cm to 0.7 ohm-cm. A p-type buried layer 44c is formed between the n-type silicon substrate 44b and the p-type epitaxial layer 44a, and is regulated to 14 to 22 ohm/square. P-type dopant impurity is selectively ion implanted into the p-type epitaxial layer 44a at dose of 1.0 E16/square-cm, and forms a heavily doped p-type region 44d merged with the p-type buried layer 44c. The heavily doped p-type region 44d is exposed to a major surface of the p-type epitaxial layer 44a. N-type dopant impurity is selectively ion implanted into the p-type epitaxial layer 44a inside the heavily doped p-type region 44d at dose of 3.5E15/square-cm, and forms an n-type base region 44e. P-type dopant impurity is selectively ion implanted into the n-type base region 44e at dose of 1.0E16/square-cm, and forms a heavily doped p-type impurity region 44f in the n-type base region 44e. The p-type buried layer 44c and the heavily doped p-type region 44d serve as a drain region, and the heavily doped p-type impurity region 44f serves as a source region. The p-type epitaxial layer 44a inside the heavily doped p-type region 44d provides a current path to the drain region.

A gate insulating layer 44g is formed on the major surface of the p-type epitaxial layer 44a inside the heavily doped p-type impurity region 44f, and is of the order of 500 angstroms thick. A polysilicon gate electrode 44h is formed on the gate insulating layer 44g, and is connected to the gate controller 41c.

A drain electrode 44j is provided on an upper surface of the heavily doped p-type region 44d, and a part of the drain electrode 44j serves as a sense electrode 44k. Thus, both of the drain electrode 44j and the sense electrode 44k are provided on the major surface of the p-type epitaxial layer 44a. A source electrode 44m is connected to the heavily doped p-type impurity region 44f, and is also provided on the major surface of the p-type epitaxial layer 44a.

Figure 13:
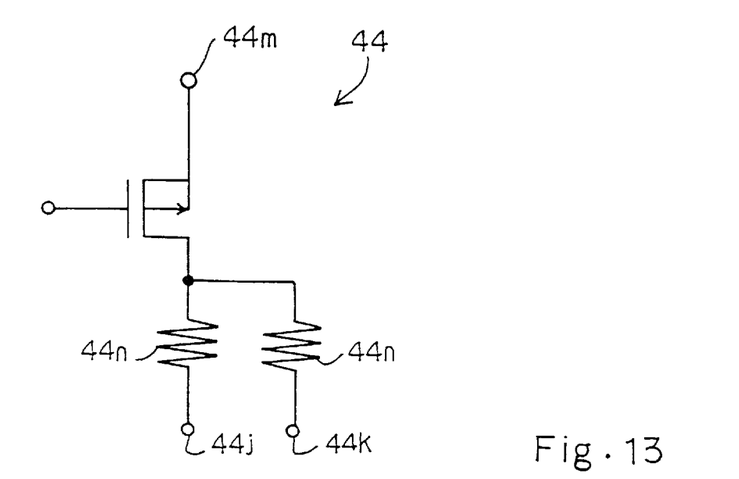
FIG. 13 is a circuit diagram showing the equivalent circuit of the vertical transistor.

A source-to-drain current path provides resistance, and the p-type region from the channel to the drain/sense electrodes 44j/44k serve as resistors 44n corresponding to the resistors 40a/40d. For this reason, the vertical transistor 44 is equivalent to the combination of the driving transistor 41a and the resistors 40a/40d, and is equivalent to the circuit shown in FIG. 13.

Third Embodiment

Figure 14:
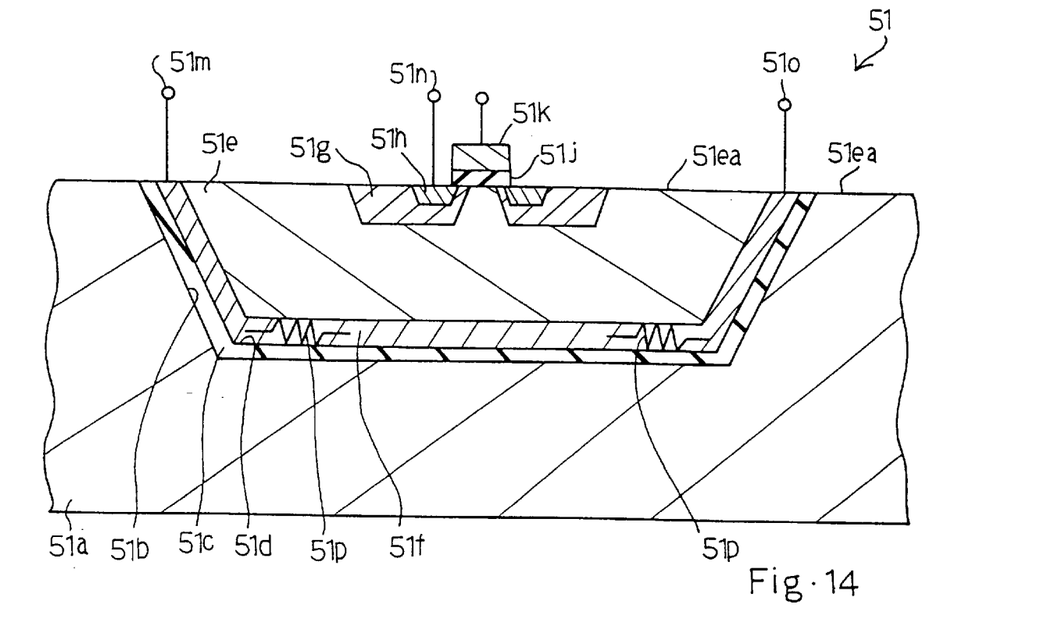
FIG. 14 is a cross sectional view showing the structure of a vertical transistor incorporated in yet another current sensing circuit according to the present invention.

FIG. 14 illustrates the structure of a vertical transistor 51 incorporated in yet another current sensing circuit embodying the present invention. The current sensing circuit implementing the third embodiment is similar to the first embodiment except for the vertical transistor 51, and, for this reason, description is focused on the vertical transistor 51.

Reference sign 51a designates a polysilicon layer, and a recess is formed in the polysilicon layer 51a. The polysilicon surface 51b is covered with a dielectric layer 51c, and the dielectric layer 51c defines a secondary recess 51d. The secondary recess 51d is filled with lightly doped n-type single crystal silicon, and the dielectric layer 51c is overlain by a lightly doped n-type single crystal silicon layer 51e. The lightly doped n-type single crystal silicon layer 51e has the resistivity ranging between 18 ohm-cm and 24 ohm-cm. The polysilicon layer 51a and the lightly doped n-type single crystal layer 51e form a semiconductor substrate structure, and a major surface 51ea extends over the polysilicon layer 51a and the lightly doped n-type single crystal layer 51e.

N-type dopant impurity is ion implanted into a boundary region between the dielectric layer 51c and the lightly doped n-type single crystal silicon layer 51e at dose of 1.0E16/square-cm, and forms a heavily doped n-type boundary region 51f. P-type dopant impurity is ion implanted into a surface region of the lightly doped n-type single crystal silicon layer 51e at dose of 3.5E15/square-cm, and forms a p-type base region 51g. N-type dopant impurity is ion implanted into the p-type base region 51g at dose of 1.0E16/square-cm, and forms a heavily doped n-type surface region 51h nested in the p-type base region 51g.

The major surface 51ea inside the heavily doped n-type surface region 51h is covered with a gate insulating layer 51j of the order of 500 angstroms thick, and a polysilicon gate electrode 51k is laminated on the gate insulating layer 51j.

The heavily doped n-type boundary region 51f serves as a drain region of the vertical transistor 51, and a drain electrode 51m is held in contact with a surface area of the heavily doped n-type boundary region 51f exposed to the major surface. On the other hand, the heavily doped n-type surface region 51h serves as a source region of the vertical transistor 51, and a source electrode 51n is held in contact with the heavily doped n-type surface region 51h. A part of the drain electrode 51m is used as a sense electrode 51o, and drain resistance 51p is formed in a source-to-drain current path. Especially, a region from the drain electrode 51m/51o toward the channel provides the drain resistance 51p.

The vertical transistor 51 also has the drain terminal 51m and the sense terminal 51o on the major surface 51ea, and the dielectric layer 51c electrically isolates the vertical transistor 51 from the polysilicon layer 51a. For this reason, a plurality of vertical transistors 51 are integrated on tile semiconductor substrate structure.

Fourth Embodiment

Figure 15:
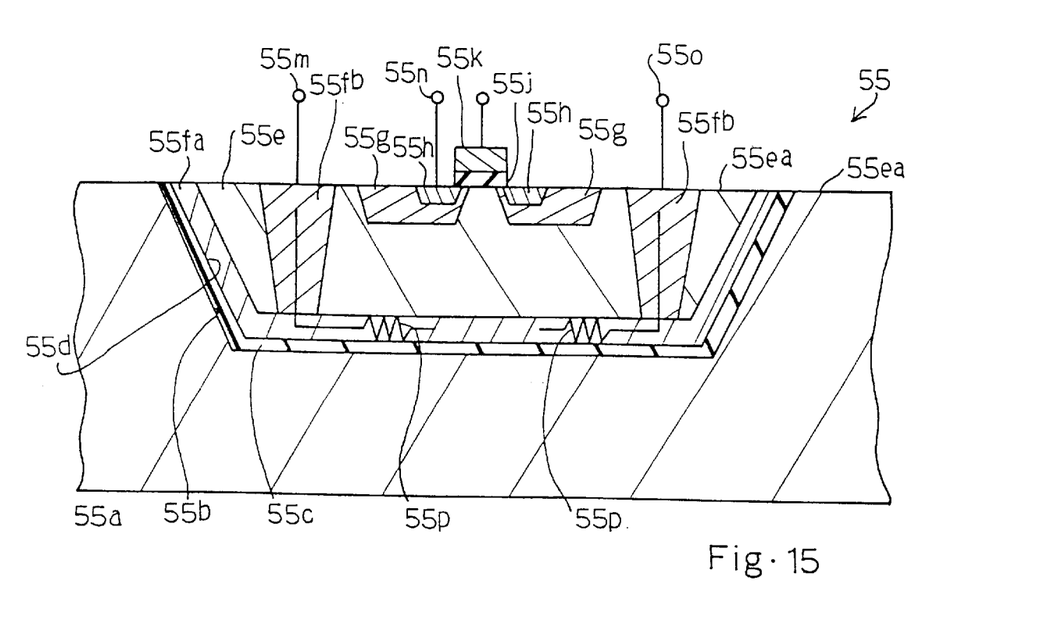
FIG. 15 is a cross sectional view showing the structure of a vertical transistor incorporated in still another current sensing circuit according to the present invention.

FIG. 15 illustrates the structure of a vertical transistor 55 incorporated in still another current sensing circuit embodying the present invention. The current sensing circuit implementing the fourth embodiment is similar to the first embodiment except for the vertical transistor 55, and, for this reason, description is focused on the vertical transistor 55.

Reference sign 55a designates a polysilicon layer, and a recess is formed in the polysilicon layer 55a. The polysilicon surface 55b is covered with a dielectric layer 55c, and the dielectric layer 55c defines a secondary recess 55d. The secondary recess 55d is filled with lightly doped n-type single crystal silicon, and the dielectric layer 55c is overlain by a lightly doped n-type single crystal silicon layer 55e. The lightly doped n-type single crystal silicon layer 55e has the resistivity ranging between 18 ohm-cm and 24 ohm-cm. The polysilicon layer 55a and the lightly doped n-type single crystal layer 55e form a semiconductor substrate structure, and a major surface 55ea extends over the polysilicon layer 55a and the lightly doped n-type single crystal layer 55e.

N-type dopant impurity is ion implanted into a boundary region between the dielectric layer 55c and the lightly doped n-type single crystal silicon layer 55e at dose of 1.0E16/square-cm, and forms a heavily doped n-type boundary region 55fa and a heavily doped n-type contact region 55fb.

P-type dopant impurity is ion implanted into a surface region of the lightly doped n-type single crystal silicon layer 55e at dose of 3.5E15/square-cm, and forms a p-type base region 55g. N-type dopant impurity is ion implanted into the p-type base region 55g at dose of 1.0E16/square-cm, and forms a heavily doped n-type surface region 55h nested in the p-type base region 55g.

The major surface 55ea inside the heavily doped n-type surface region 55h is covered with a gate insulating layer 55j of the order of 500 angstroms thick, and a polysilicon gate electrode 55k is laminated on the gate insulating layer 55j.

The heavily doped n-type boundary region 55fa and the heavily doped n-type contact region 55fb serve as a drain region of the vertical transistor 55, and a drain electrode 55m is held in contact with a surface area of the heavily doped n-type contact region 55fb exposed to the major surface 55ea. On the other hand, the heavily doped n-type surface region 55h serves as a source region of the vertical transistor 55, and a source electrode 55n is held in contact with the heavily doped n-type surface region 55h. A part of the drain electrode 55m is used as a sense electrode 55o, and drain resistance 55p is formed in a source-to-drain current path. Especially, a region from the drain electrode 55m/55o toward the channel provides essential part of he drain resistance 55p.

The vertical transistor 55 also has the drain terminal 55m and the sense terminal 55o on the major surface 55ea, and the dielectric layer 55c electrically isolates the vertical transistor 55 from the polysilicon layer 55a. For this reason, a plurality of vertical transistors 55 are integrated on the semiconductor substrate structure. Moreover, the heavily doped n-type contact region 55fb allows the manufacturer to appropriately locate the drain/sense terminals 55m/55o.

Fifth Embodiment

Figure 16:
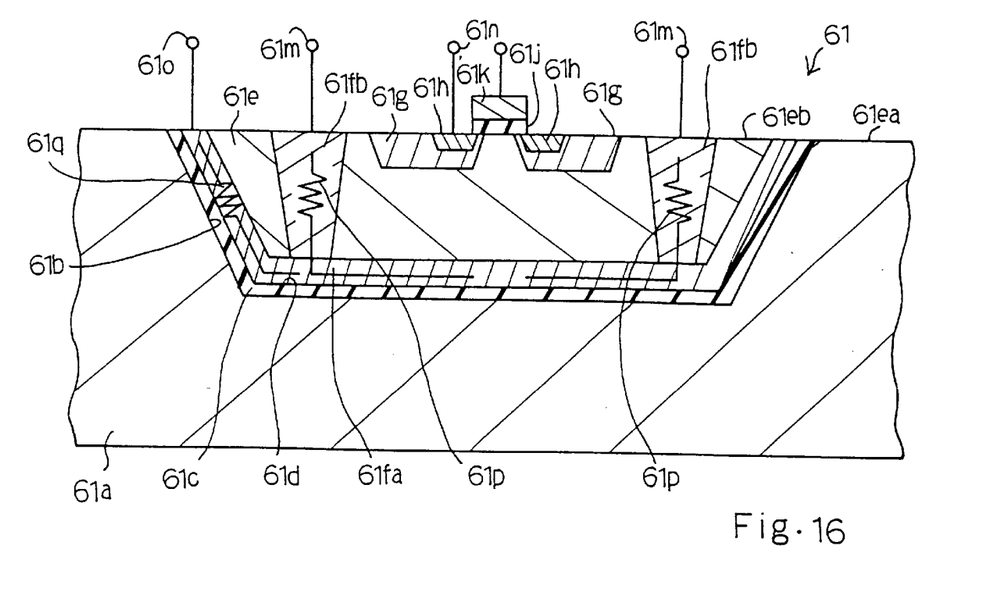
FIG. 16 is a cross sectional view showing the structure of a vertical transistor incorporated in another current sensing, circuit according to the present invention.

FIG. 16 illustrates the structure of a vertical transistor 61 incorporated in another current sensing circuit embodying the present invention. The current sensing circuit implementing the fifth embodiment is similar to the first embodiment except for the vertical transistor 61, and, for this reason, description is focused on the vertical transistor 61.

Reference sign 61a designates a polysilicon layer, and a recess is formed in the polysilicon layer 61a. The polysilicon surface 61b is covered with a dielectric layer 61c, and the dielectric layer 61c defines a secondary recess 61d. The secondary recess 61d is filled with lightly doped n-type single crystal silicon, and the dielectric layer 61c is overlain by a lightly doped n-type single crystal silicon layer 61e. The lightly doped n-type single crystal silicon layer 61e has the resistivity ranging between 18 ohm-cm and 24 ohm-cm. The polysilicon layer 61a and the lightly doped n-type single crystal layer 61e form a semiconductor substrate structure, and a major surface 61 ea extends over the polysilicon layer 61a and the lightly doped n-type single crystal layer 61e.

N-type dopant impurity is ion implanted into a boundary region between the dielectric layer 61c and the lightly doped n-type single crystal silicon layer 61e at dose of 1.0E16/square-cm, and forms a heavily doped n-type boundary region 61fa and a heavily doped n-type contact region 61fb.

P-type dopant impurity is ion implanted into a surface region of the lightly doped n-type single crystal silicon layer 61e at dose of 3.5E15/square-cm, and forms a p-type base region 61g. N-type dopant impurity is ion implanted into the p-type base region 61g at dose of 1.0E16/square-cm, and forms a heavily doped n-type surface region 61h nested in the p-type base region 61g.

The major surface 61ea inside the heavily doped n-type surface region 61h is covered with a gate insulating layer 61j of the order of 500 angstroms thick, and a polysilicon gate electrode 61k is laminated on the gate insulating layer 61j.

The heavily doped n-type boundary region 61fa and the heavily doped n-type contact region 61fb serve as a drain region of the vertical transistor 61, and a drain electrode 61m and a sense electrode 61o are respectively held in contact with a surface area of the heavily doped n-type contact region 61fb and the heavily doped n-type boundary region 61fa both exposed to the major surface 61ea. On the other hand, the heavily doped n-type surface region 61h serves as a source region of the vertical transistor 61, and a source electrode 61n is held in contact with the heavily doped n-type surface region 61h.

Drain resistance 61p and sense resistance 61q are formed in a source-to-drain current path. Especially, a region from the drain/sense electrodes 61m/61o toward the channel provides essential part of the drain/sense resistance 61p/61q.

The vertical transistor 61 also has the drain terminal 61m and the sense terminal 61o on the major surface 61ea, and the dielectric layer 61c electrically isolates the vertical transistor 61 from the polysilicon layer 61a. For this reason, a plurality of vertical transistors 61 are integrated on the semiconductor substrate structure. Moreover, the heavily doped n-type contact region 55fb allows the manufacturer to appropriately locate the drain/sense terminals 61m/61o, and the separation between the drain terminal 61m and the sense terminal 61o allows the manufacturer to independently regulate the drain resistance 61p and the sense resistance 61q.

Sixth Embodiment

Figure 17:
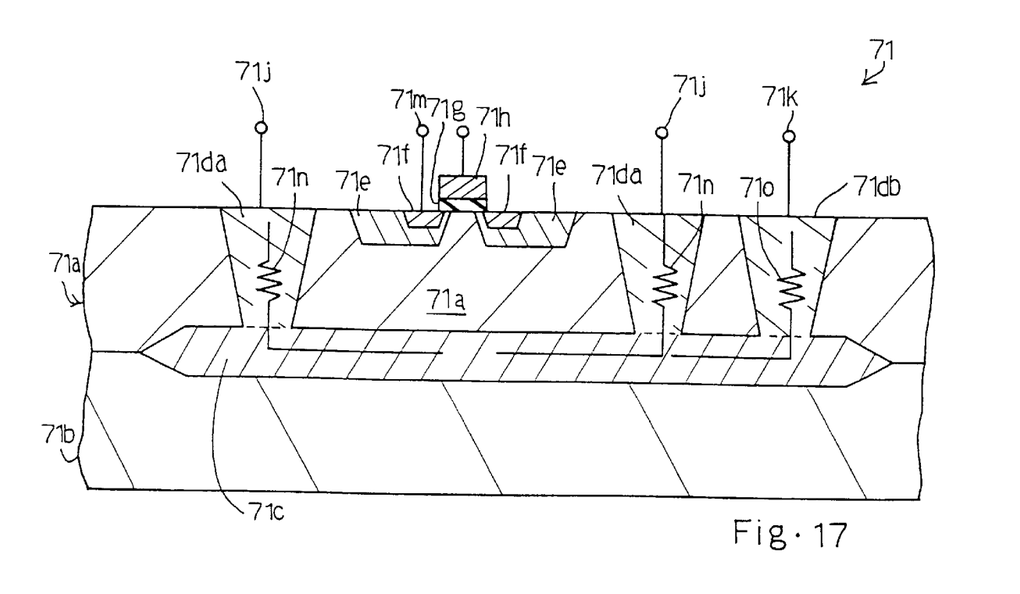
FIG. 17 is a cross sectional view showing the structure of a vertical transistor incorporated in another current sensing circuit according to the present invention.

FIG. 17 illustrates the structure of a vertical transistor 71 incorporated in another current sensing circuit embodying the present invention. The current sensing circuit implementing the sixth embodiment is similar to the first embodiment except for the vertical transistor 71, and, for this reason description is focused on the vertical transistor 71.

An n-type epitaxial layer 71a is grown to 8 microns to 10 microns thick on a p-type silicon substrate 71b, and the resistivity of the n-type epitaxial layer 71a is 0.5 ohm-cm to 0.7 ohm-cm. An n-type buried layer 71c is formed between the p-type silicon substrate 71b and the n-type epitaxial layer 71a, arid is regulated to 14 to 22 ohm/square.

N-type dopant impurity is selectively ion implanted into the n-type epitaxial layer 71a at dose of 1.0E16/square-cm, and forms a heavily doped n-type contact region 71da merged with the n-type buried layer 71c. The heavily doped n-type contact region 71da is exposed to a major surface of the p-type epitaxial layer 71a. N-type dopant impurity is further ion implanted into the n-type epitaxial layer 71a, and forms another heavily doped n-type contact region 71db also exposed to the major surface. P-type dopant impurity is selectively ion implanted into the n-type epitaxial layer 71a inside the heavily doped n-type contact region 71d at dose of 3.5E15/square-cm, and forms a p-type base region 71e. N-type dopant impurity is selectively ion implanted into the p-type base region 71e at dose of 1.0E16/square-cm, and forms a heavily doped n-type surface region 71f in the p-type base region 71e. The n-type buried layer 71c and the heavily doped n-type contact region 71da serve as a drain region, and the heavily doped n-type surface region 71f serves as a source region. The n-type epitaxial layer 71a inside the heavily doped n-type contact region 71da provides a current path to the drain region.

A gate insulating layer 71g is formed on the major surface of the n-type epitaxial layer 71a inside the heavily doped n-type surface region 71f, and is of the order of 500 angstroms thick. A polysilicon gate electrode 71h is formed on the gate insulating layer 71g.

A drain electrode 71j is provided on the heavily doped n-type contact region 71da, and a sense electrode 71k is formed on the heavily doped n-type contact region 71db. Thus, both of the drain electrode 71j and the sense electrode 71k are provided on the major surface of the n-type epitaxial layer 71a. A source electrode 71m is connected to the heavily doped n-type surface region 71f, and is also provided on the major surface of the n-type epitaxial layer 71a.

The manufacturer appropriately gives drain resistance 71n and sense resistance 71o to the drain electrode 71j and the sense electrode 71k, because the heavily doped n-type contact region 71db is spaced from the heavily doped n-type contact region 71da.

As will be appreciated from the foregoing description, the current sensing circuit achieves the following advantages.

First, no detecting transistor is required for the current sensing circuit according to the present invention. The driving transistor 2 and the detecting transistor 1b occupies 40 square-micron. The isolation structure and the peripheral structure should be identical therebetween, and require a margin of the order of 180 microns. However, the current sensing circuit does not require the detecting transistor and the margin. The deletion of the detecting transistor 1b decreases the occupation area by 0.05 square-millimeter, and the deletion of the margin results in reduction of the occupation area of 0.05 square-millimeter.

The current sensing circuit according to the present invention does not require the switching inverter 10a, because the detecting transistor 30b electrically isolates the voltage comparator from the negative power voltage line. As a result, the component transistors are decreased by two.

Finally, the vertical transistor according to the present invention has the drain electrode, the source electrode and the sense electrode on the major surface of the semiconductor substrate structure, and a plurality of vertical transistors are integrated on the single semiconductor substrate structure. For this reason, the current driving circuit accompanied with the current sensing circuit supplies different power potentials to external loads, and reduces the production cost.

Although particular embodiments of the present invention have been shown and described, it will be obvious to those skilled in the art that various changes and modifications may be made without departing from the spirit and scope of the present invention.

What is claimed is:

1. A current sensing circuit for monitoring a current driving transistor connected at a first current node thereof to a load to see whether or not the amount of driving current is within a standard range, comprising:

a current-to-voltage converter connected between a power voltage line and a second current node of said current driving transistor for producing a potential level variable with the amount of said driving current at said second current node, said current-to-voltage converter and said current driving transistor being implemented by a vertical transistor fabricated on a semiconductor substrate structure having a major surface, said vertical transistor including a drain region of a first conductivity type formed on said semiconductor substrate and providing said second current node and a sensing node on a first area exposed to said major surface, a base region of a second conductivity type opposite to said first conductivity type and formed over a second area of said drain region, a source region of said first conductivity type formed in a central area of said base region and having an area serving as said first current node and exposed to said major surface, a channel region formed between said drain region and said base region for providing a current path between said drain region and said source region, a gate insulating layer covering a part of said channel region and a peripheral area of said base region, and a gate electrode formed on said gate insulating layer;

a reference potential source for producing a constant reference potential level; and a voltage comparator having two input nodes connected to said sense node and said reference potential source so as to compare said potential level with said reference potential level for producing a signal representative of said driving current out of said standard range.

2. The current sensing circuit as set forth in claim 1, in which said semiconductor substrate structure includes a first semiconductor layer of said second conductivity type, and a second semiconductor layer of said first conductivity type epitaxially grown on said first semiconductor layer and providing said major surface, and said drain region includes a buried layer of said first conductivity type formed in a boundary region between said first semiconductor layer and said second semiconductor layer and larger in dopant concentration than said second semiconductor layer, and a first contact region of said first conductivity type extending from said major surface to said buried layer.

3. The current sensing circuit as set forth in claim 2, in which said first contact region provides said first area where said second current node and said sensing node are provided.

4. The current sensing circuit as set forth in claim 2, in which said drain region further includes a second contact region of said first conductivity type expending from said major surface to said buried layer and spaced from said first contact region, and said second current node and said sensing node are provided on said first contact region and said second contact region, respectively.

5. The current sensing circuit as set forth in claim 1, in which said semiconductor substrate structure includes a first semiconductor layer providing a part of said major surface and having an upper surface defining a primary recess, an insulating layer covering said upper surface of said first semiconductor layer so as to define a secondary recess, and a second semiconductor layer of said first conductivity type filling said secondary recess and providing said major surface and providing another part of said major surface, and said drain region includes a boundary layer of said first conductivity type formed between said insulating layer and said second semiconductor layer and partially exposed to said major surface.

6. The current sensing circuit as set forth in claim 5, in which said second current node and said sensing node are provided on said boundary layer exposed to said major surface.

7. The current sensing circuit as set forth in claim 5, in which said drain region further includes a contact region of said first conductivity type extending from said major surface of said second semiconductor layer to said boundary layer, and said second current node and said sensing node are provided on said contact region exposed to said major surface.

8. The current sensing circuit as set forth in claim 5, in which said drain region further includes a contact region of said first conductivity type extending from said major surface of said second semiconductor layer to said boundary layer, and said second current node and said sensing node are respectively provided on said boundary layer and said contact region both exposed to said major surface.

9. The current sensing circuit as set forth in claim 1, in which said current-to-voltage converter is implemented by a resistance coupled between the source region and said drain region.

* * * * *